United States Patent
Wang et al.

(10) Patent No.: US 9,991,147 B2
(45) Date of Patent: Jun. 5, 2018

(54) WAFER GROUNDING AND BIASING METHOD, APPARATUS, AND APPLICATION

(71) Applicant: Hermes Microvision Inc., Hsinchu (TW)

(72) Inventors: Yi-Xiang Wang, Fremont, CA (US); Juying Dou, San Jose, CA (US); Kenichi Kanai, Palo Alto, CA (US)

(73) Assignee: HERMES MICROVISION, INC., Hsin-Chu (TW)

(*) Notice: Subject to any disclaimer, the term of this patent is extended or adjusted under 35 U.S.C. 154(b) by 0 days. days.

(21) Appl. No.: 14/531,263

(22) Filed: Nov. 3, 2014

(65) Prior Publication Data

US 2015/0049411 A1 Feb. 19, 2015

Related U.S. Application Data

(63) Continuation-in-part of application No. 12/552,270, filed on Sep. 1, 2009, now Pat. No. 8,908,348.

(51) Int. Cl.

| | |
|---|---|
| *H01L 21/683* | (2006.01) |
| *B82Y 10/00* | (2011.01) |
| *B82Y 40/00* | (2011.01) |
| *H01J 37/20* | (2006.01) |
| *H01J 37/28* | (2006.01) |
| *H01J 37/317* | (2006.01) |

(52) U.S. Cl.
CPC ......... *H01L 21/6831* (2013.01); *B82Y 10/00* (2013.01); *B82Y 40/00* (2013.01); *H01J 37/20* (2013.01); *H01J 37/28* (2013.01); *H01J 37/3174* (2013.01); *H01J 2237/0044* (2013.01); *H01J 2237/2008* (2013.01)

(58) Field of Classification Search
CPC . H01L 21/6831; H01L 21/6833; B82Y 10/00; H01J 37/28; H01J 37/3174
USPC ........................................................ 361/234
See application file for complete search history.

(56) References Cited

U.S. PATENT DOCUMENTS

| | | | |
|---|---|---|---|
| 7,408,760 B2 | 8/2008 | Tanimoto et al. | |
| 7,667,944 B2 | 2/2010 | Naim | |
| 2001/0002871 A1* | 6/2001 | Nagao | G03F 7/70691 361/234 |

* cited by examiner

*Primary Examiner* — Dharti Patel
(74) *Attorney, Agent, or Firm* — Finnegan, Henderson, Farabow, Garrett & Dunner, LLP (57) ABSTRACT

A wafer grounding apparatus and method adaptable to a charged particle beam apparatus is disclosed. A wafer substrate is supported by a wafer mount. A pulse current pin is arranged to be in contact with a backside film formed on a backside of the wafer substrate. A grounding pulse generator provides at least one pulse to drive the pulse current pin such that dielectric breakdown occurring at the backside film leads to establishment of a current path through the backside films. Accordingly, a current flows in the wafer substrate through this current path and then flows out of the wafer substrate via at least one current return path formed from capacitive coupling between the wafer substrate and the wafer mount.

22 Claims, 8 Drawing Sheets

WAFER GROUNDING AND BIASING METHOD, APPARATUS, AND APPLICATION

CROSS REFERENCE TO RELATED PATENT APPLICATION

This patent application is a continuation in part of U.S. patent application Ser. No. 12/552,270 filed Sep. 1, 2009, the contents of which are incorporated herein by reference.

FIELD OF THE INVENTION

The present invention generally relates to a charged particle beam apparatus, and more particularly to a wafer grounding and biasing apparatus and method thereof adaptable to a charged particle beam apparatus for semiconductor wafer manufacture.

BACKGROUND OF THE INVENTION

A charged particle beam apparatus is one which is able to produce a 2-dimensional image of a wafer substrate by detecting secondary electrons, backscattered electrons, mirror electrons, or other kind of electrons from the surface of the wafer substrate upon impingement by a charged particle beam generated by a charged particle beam apparatus. Various charged particle beam apparatus are used on semiconductor wafers in the semiconductor industry for various purposes such as wafer processing (for example, e-beam direct-write lithography system), process monitoring (for example, critical dimension scanning electron microscope, or CD-SEM), wafer inspection (for example, e-beam inspection system), defect analysis (for example, defect review SEM, or DR-SEM and Focused Ion Beam system, or FIB), etc. When such an apparatus performs its function, the electrical potential of the wafer substrate needs to be held at a predetermined value, i.e. the wafer substrate has to be biased. This can be achieved by electrically, or more specifically, resistively connecting the target wafer substrate to a programmable DC (direct current) voltage source (i.e. Wafer Bias Supply) when the wafer substrate interacts with the charged particle beam, during which process excess charges are brought to the wafer substrate. This process will be referred to as "wafer biasing" in this specification.

For wafer biasing, the electrical contact from the wafer bias supply to the wafer substrate is conventionally made at the backside of the wafer substrate by using electrical contact(s) which press against the backside surface of the wafer substrate as the front surface of the wafer is inappropriate to place the electrical contact. However, the backside surface of the wafer substrate is usually covered by thin layers of dielectric materials such as silicon oxide and nitrides, created as sub-products of wafer manufacturing process steps. Therefore, the required conductance between the contact(s) and the wafer substrate generally cannot be established by simply pressing the contact(s) against the wafer's backside surface. A stable and low-resistance DC path(s) between the electrical contact(s) and the wafer substrate must be established first. Such action is often referred to as "wafer grounding", and the term will be used throughout this application while the electrical contacts are called "pulse current pins" or "neutralizing pins".

One of the conventionally used methods for wafer grounding is the mechanical piercing method. In this method, the pulse current pin is made of a hard conductive material with a very sharp tip, which is used to physically pierce through the backside films and makes direct contact to the wafer substrate thereby establishing a stable and low-resistance DC path, which will be referred to as a wafer bias current path hereinafter, between the pulse current pin and the substrate as the pulse current pin is pressed against the backside surface of the wafer. The mechanical piercing method is simple and reliable, but it tends to create a large number of particles which may interfere with efforts to obtain high manufacturing yield of the finished products, i.e. semiconductor chips.

Figure 1:
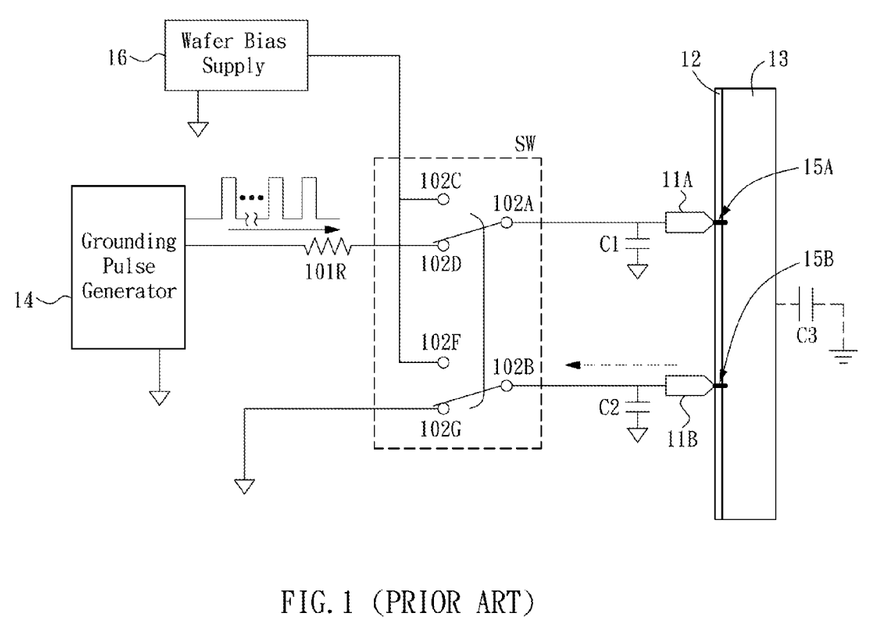
FIG. 1 schematically illustrates the concept of conventional wafer grounding/wafer biasing apparatus employing the electrical zapping method.

Another method commonly used is the electrical zapping method. FIG. 1 schematically illustrates the concept of a conventional wafer grounding/wafer biasing apparatus employing the electrical zapping method. A wafer backside film (s) 12 is present on the back of a wafer substrate 13. Two contact pins 11A and 11B pressing against the wafer backside film(s) 12 are used as the pulse current pin and neutralizing pin, and a high voltage pulse or pulses are applied between the pulse current pin 11A and neutralizing pin 11B by a grounding pulse generator 14 via a resistor 101R. Unlike the mechanical piercing method, the electrical zapping method does not pierce through the backside film. The process produces two current paths, one 15A between the drive-side pulse current pin 11A and the wafer substrate 13 and the other 15B between the return-side neutralizing pin 11B and the wafer substrate 13.

A drive-side pulse current pin is a pin for creating a current path through which a current flows into the wafer substrate 13, and a return-side neutralizing pin is for creating another current path through which a current flows out of the water substrate 13. The electrical zapping method involves two successive dielectric breakdowns, the first between the pulse current pin 11A and the wafer substrate 13 whereupon the current path 15A is created, and the second between the neutralizing pin 11B and the wafer substrate 13 whereupon the current path 15B is established. When pulsing (by grounding pulse generator 14) is done and both of the current paths 15A/15B yield a stable and low-resistance DC path, two wafer bias current paths are established, with one between pulse current pin 11A and the wafer substrate 13 (will still be referred to as 15A) and the other between the neutralizing pin 11B and the wafer substrate 13 (will still be referred to as 15B). The wafer grounding is thus completed.

After the wafer grounding is completed, the pulse current pin 11A and neutralizing pin 11B are electrically disconnected from the grounding pulse generator 14 and the connection to the system ground, respectively, and the current return path from the wafer substrate 13 to the system ground is now switched to be connected to a wafer bias supply 16. The wafer bias supply 16 is for providing the proper bias voltage to the wafer substrate 13 through the above established two wafer bias current paths 15A/15B.

For more accurate description of the wafer grounding process, the following stray capacitances are taken in considerations. Small stray capacitances C1 and C2 are parasitic to the pulse current pin 11A and neutralizing pin 11B, respectively. The pulse current pin 11A and neutralizing pin 11B are coupled to the system ground or the equivalent through the capacitances C1 and C2, respectively. Capacitance C3 is parasitic to wafer substrate 13. The wafer substrate 13 is coupled to the system ground or the equivalent through capacitance C3.

When the wafer grounding is being performed, the puke current pin 11A should be connected with the grounding pulse generator 14 i.e. node 102A is connected with node 102D, and the neutralizing pin 11B should be electrically connected to the system ground i.e. node 102B is connected with node 102G.

As an initial state, the tips of the pulse current pin 11A and neutralizing pin 11B are pressed against the surface of the backside films 12. The wafer substrate 13 is electrically floated. DC wise, being isolated from the pulse current pin 11A and neutralizing pin 11B by the backside dielectric film(s) 12. The potential of the substrate 13 is electrostatically held near ground level by capacitance C3.

A high-voltage (e.g., greater than 100 volts) grounding pulse or pulses are then applied from the grounding pulse generator 14 to the pulse current pin 11A, via a resistor 101R and a connected switch SW (node 102A connected with node 102D, and node 102B connected with node 102G). When being applied to the pulse current pin 11A, the grounding pulse(s) also charge up stray capacitance C1 and a small capacitance formed between the pulse current pin 11A and the wafer substrate 13.

Very high electrical field is formed across the backside dielectric films 12 between pulse current pin 11A and wafer substrate 13 (whose potential is held near ground level by the capacitance C3). This high electrical field causes a dielectric breakdown, the first dielectric breakdown, through the backside films 12 between the pulse current pin 11A and the wafer substrate 13. A breakdown current thus flows through the backside films 12. The breakdown current is a very intense, short-duration pulse current sourced by the stray capacitance C1 and the small capacitance between the pulse current pin 11A and the substrate 13. The flow of the breakdown current yields an initial current path 15A between the pulse current pin 11A and the wafer substrate 13. The current path 15A initially may not necessarily be a stable current path and may be only temporarily present. Immediately following the breakdown current, additional current sourced by the grounding pulse generator 14 via resistor 101R starts to flow through the initial current path 15A. This subsequent current is named "grounding pulse current" for convenience of description in this application. There is no clear separation between the breakdown current and the grounding pulse current. However, the grounding pulse current may continue to flow until the grounding pulse generator 14 ceases pulsing. The grounding pulse current may reduce and/or stabilize the resistance of the current path 15A.

Generally, the dielectric breakdown process induces a structural damage on the backside dielectric films in the vicinity of the pulse current pin, with a magnitude depending on the energy involved. The grounding pulse current may also lead to further damages on the backside film(s) 12 as it continues.

The current flowing into wafer substrate 13 (the breakdown current and the grounding pulse current combined) charges the capacitance C3, raising the electrical potential of the wafer substrate 13. Accordingly, a very high electrical field across the backside dielectric films 12 is formed between the wafer substrate 13 and the neutralizing pin 11B and causes another dielectric breakdown, the second dielectric breakdown, through the backside films 12 between the wafer substrate 13 and the neutralizing pin 11B, initiating a current path 15B. This time, the breakdown current (mainly sourced by the stray capacitance C2 and the small capacitance between the neutralizing pin 11B and the wafer substrate 13) may further include a rush current sourced by the charge stored in the capacitance C3 as the neutralizing pin 11B is connected to the ground through the low resistance DC path. As the current path 15B is generated, it will provide a DC return path for the grounding pulse current, increasing the current flowing through the current path 11A from the resistor 101R and letting a good portion of the current flow down to ground through the current path 15B and the rest flow into capacitance C3.

The breakdown current at the second break down produces a structural damage on the backside film(s) 12 in the vicinity of the neutralizing pin 11B. As the grounding puke current continues flowing until the grounding pulse(s) ceases, further structural damages may be caused on the backside films 12 in the vicinities of the pulse current pin 11A and neutralizing pin 11B. At the same time the resistances of the current paths 15A/15B may be reduced and/or stabilized.

When the grounding pulse generator 14 completes the last grounding pulse and each of the current paths 15A/15B yields a stable and low-resistance DC path, a wafer bias current path is established at the same position of the individual current path 15A/5B, and the wafer grounding process is completed. The established wafer bias current paths will still be referred to as 15A (between pulse current pin 11A and substrate 13) and 15B (between neutralizing pin 11B and substrate 13), respectively.

The overall wafer grounding/biasing process is then to be taken into the next phase, the wafer biasing process. The pulse current pin 11A and neutralizing pin 11B are electrically disconnected from the grounding pulse generator 14 and the connection to the system ground, respectively. Then, the both of the pulse current pin 11A and neutralizing pin 11B are now connected to the wafer bias supply 16, i.e. node 102A is connected with node 102C and node 102B is connected with node 102F, in order to provide the proper bias voltage to the wafer substrate 13 through the wafer bias current paths for the subsequent operation.

Figure 2:
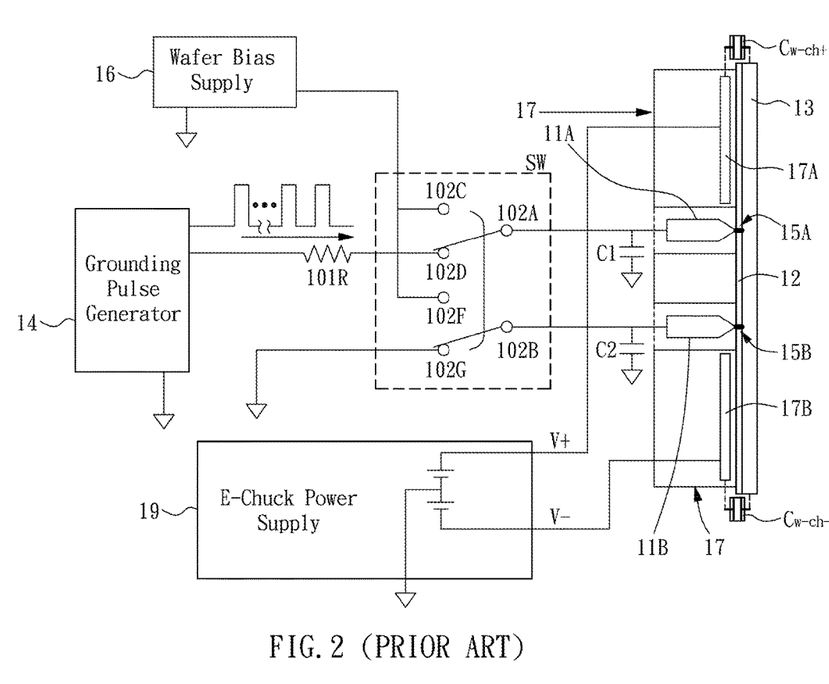
FIG. 2 is a schematic illustration of in-practice instrumentation of the conventional wafer grounding/wafer biasing apparatus.

Referring to FIG. 2, which is a schematic illustration of in-practice instrumentation of the conventional wafer grounding/wafer biasing apparatus. As shown, a wafer mount 17, such as an electrostatic chuck (e-chuck), is used to hold or support the wafer substrate 13. Before the wafer grounding is performed, the wafer substrate 13 needs be clamped by the e-chuck 17, which usually includes at least one positive electrode 17A (driven by a positive DC voltage V+), and at least one negative electrode 17B (driven by a negative DC voltage V−). An e-chuck power supply 19 supplies proper voltages to the positive electrode 17A and the negative electrode 17B.

Due to the substantially large areas of electrodes 17A/17B which face the wafer substrate 13 with a small distance, large capacitances between each electrode(s) 17A/17B and wafer substrate 13 are incurred. For example, there is a first chuck-referred capacitance Cw-ch+ between the wafer substrate 13 and the positive electrode(s) 17A, and a second chuck-referred capacitance Cw-ch− between the wafer substrate 13 and the negative electrode(s) 17B.

In FIG. 1, the substrate stray capacitance C3 is assumed to be small as FIG. 1 is a conceptual model of wafer grounding apparatus where the effect of the presence of e-chuck electrodes 17A, and 17B is not considered. However, in practice, such as in the configuration in FIG. 2, the size of the capacitance on the wafer substrate 13, Cw-ch+ and Cw-ch− combined, is substantially larger than the assumed capacitance C3 in FIG. 1. This may affect the structural damage actually caused to the backside film(s) 12 during the wafer grounding process.

For example, after the initial current path 15A is generated between the pulse current pin 11A and the wafer substrate 13 by the first dielectric breakdown, the incoming grounding pulse current needs to raise the potential of the wafer substrate 13 high enough to trigger the second dielectric breakdown between the wafer substrate 13 and the neutralizing pin 11B. This is done by the grounding pulse current charging the capacitances Cw-ch+ and Cw-Ch−, both of which are significantly larger than the assumed stray capacitance C3 in FIG. 1. As a result, more significant structural damage may be caused to the backside films 12 in the vicinity of the pulse current pin 11A as a much larger "net" current, i.e. the current integrated over time, flows through the current path 15A between the pulse current pin 11A and the substrate 13.

On the other hand, the rush current sourced by the capacitances Cw-ch+ and Cw-ch− running through the current path 15B created by the second dielectric breakdown between the wafer substrate 13 and the neutralizing pin 11B will take a longer time to decay as a large quantity of charge has been stored in the capacitances Cw-ch+ and Cw-ch− and needs to be released. Therefore, more severe structural damage on the backside film(s) in the vicinity of the neutralizing pin 11B may result.

For the foregoing discussions, a need has arisen to propose a novel wafer grounding/potential holding apparatus for solving the grounding damage problem.

SUMMARY OF THE INVENTION

In view of the foregoing, it is an object of the embodiment to provide an apparatus and method adaptable to a charged particle beam apparatus for facilitating wafer grounding/wafer biasing with a simple architecture and operation, thereby allowing straightforward optimization of the grounding drive condition with less restrictions for minimizing the grounding damage while assuring a stable and low-resistance wafer bias current path.

According to one embodiment of the present invention, a wafer grounding and biasing apparatus is disclosed. The disclosed wafer grounding and biasing apparatus comprises a wafer mount for supporting a wafer substrate, a pulse current pin arranged to be in contact with at least one backside film formed on the backside of the wafer substrate, and a grounding pulse generator for providing at least one pulse to drive the pulse current pin such that the dielectric breakdown occurring at the backside films leads to the establishment of a current path through the backside films, wherein a pulse current flows in the wafer substrate through this current path and then flows out of the wafer substrate via at least one current return path formed from the capacitive coupling between the wafer substrate and the wafer mount.

The disclosed wafer grounding and biasing apparatus is adaptable to a charged particle beam apparatus. The charged particle beam apparatus is able to produce a 2-dimensional image of a wafer substrate by detecting secondary electrons, backscattered electrons, mirror electrons, or other kinds of electrons from the surface of the wafer substrate upon impingement by a charged particle beam generated by the charged particle beam apparatus. The charged particle beam apparatus may at least be comprised of a charged particle beam generator for generating a charged particle beam to impinge on the surface of the wafer substrate, an electron detector for detecting electrons from the surface of the wafer substrate being impinged, and an image generator electrically coupled to the electron detector for generating images of the substrate surface according to the electrons detected by the electron detector.

According to one embodiment of the present invention, a wafer grounding and biasing method is disclosed. The disclosed method comprises supporting a wafer substrate with a wafer mount, arranging a pulse current pin to be in contact with a backside film formed on the backside of the wafer substrate, providing at least one pulse to drive the pulse current pin such that dielectric breakdown occurring at the backside films leads to establishment of a current path through the backside films, wherein a pulse current flows in the wafer substrate through this current path and then flows out of the wafer substrate via at least one current return path formed from capacitive coupling between the wafer substrate and the wafer mount.

DESCRIPTION OF THE EXEMPLARY EMBODIMENTS

Although the present invention will be described in accordance with the embodiments shown below, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

Figure 3A:
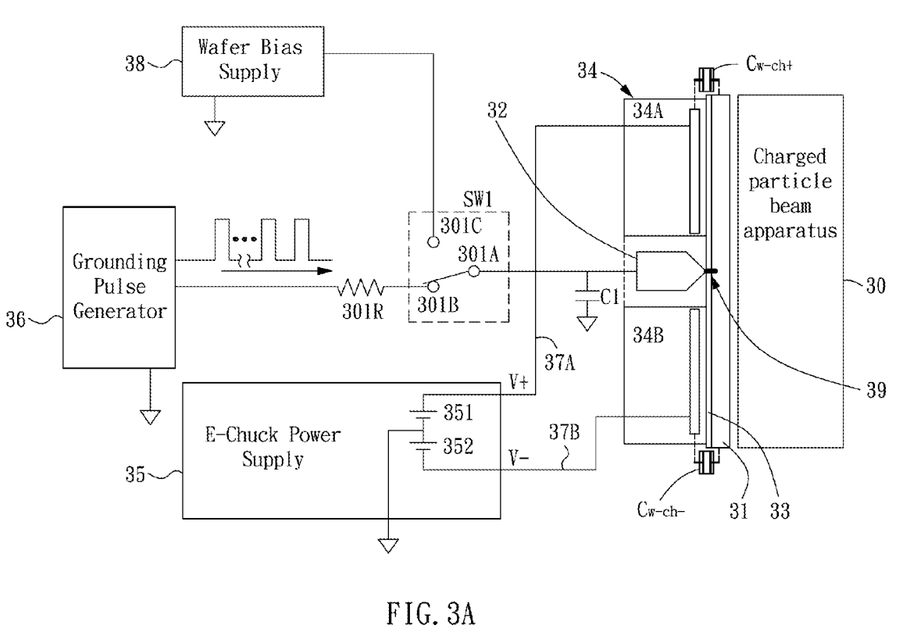
FIG. 3A is a schematic illustration of a wafer grounding and wafer biasing apparatus adaptable to a charged particle beam apparatus according to a first embodiment of the present invention.
Figure 3B:
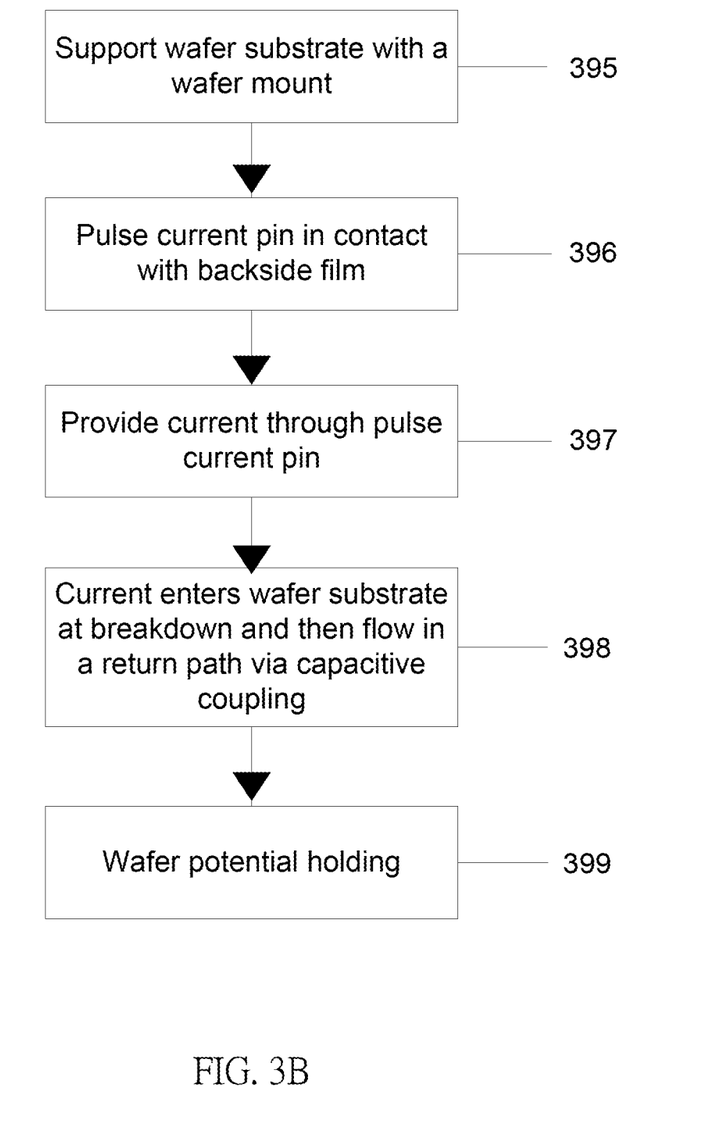
FIG. 3B illustrates a flow diagram associated with the apparatus of FIG. 3A.

FIG. 3A is a schematic illustration of a wafer grounding and wafer biasing apparatus adaptable to a charged particle beam apparatus 30 according to a first embodiment of the present invention. FIG. 3B illustrates a flow diagram associated with the apparatus of FIG. 3A. It is noted that in the following descriptions, same reference numerals are used to denote the same elements as in the previous embodiment (FIG. 1 and FIG. 2) where applicable.

Referring to FIG. 3A and FIG. 3B, before the wafer substrate 31 is subjected to the electron beam inspection, the wafer substrate 31 may be supported and held, in the step 395, by a wafer mount 34, which is capacitively coupled to the wafer substrate 31 according to the current embodiment. In this specification, "capacitively coupled" means that substantive capacitance is formed between the wafer substrate 31 and conductive element(s) of the wafer mount 34. The conductive element(s) must be electrically connected to the system ground (or its equivalent) through a low impedance electrical path according to the current embodiment. Therefore, a relatively low resistance current path is formed from the wafer substrate 31 to the system ground or its equivalent through the capacitance formed between the conductive element(s) of the wafer mount 34 and the wafer substrate 31, and the low resistance path from the conductive elements of the wafer mount 34 to the system ground or its equivalent. When current is injected to the substrate 31 through the pulse current pin 32, the above current path from substrate 31 to the system ground acts as a low impedance return path for the injected current. In FIG. 3A, an electrostatic chuck (e-chuck) is exemplified in the embodiment as the wafer mount 34.

The e-chuck 34 contains multiple flat electrodes, positive electrode(s) 34A and negative electrode(s) 34B, all of which are arranged within a single flat plane and covered by a thin spacer made of dielectric material. The wafer substrate 31 is mounted and chucked on the thin dielectric spacer by an electrostatic force when voltages are applied to the electrodes 34A/34B. Because of the large surface areas of the chuck electrodes 34A/34B facing the wafer substrate 31 with a small gap, a relatively large capacitance is formed between each electrode 34A/34B and the wafer substrate 31, namely chuck-referred capacitance Cw-ch+ for positive electrode(s) 34A and chuck-referred capacitance Cw-ch− for negative electrode(s) 34B. In this embodiment, the electrodes 34A/34B serve as the conductive elements of the wafer mount 34.

The positive electrode(s) 34A and negative electrode(s) 34B are driven respectively by a positive voltage V+ and a negative voltage V− supplied by an e-chuck power supply 35. (The amplitude of the positive voltage V+ and the amplitude of the negative voltage V− may, but not necessarily, be the same.) The e-chuck power supply 35, for example, a bipolar DC voltage source, includes a positive DC voltage source 351 and a negative DC voltage source 352. The common node of the two sources 351/352 is electrically connected to the system ground, as shown in FIG. 3A. Therefore, electrodes 34A and 34B are electrically connected to the system ground through low impedance paths, as the DC voltage sources 351/352 act as very low impedance load for incoming current by definition. Conventional DC power supplies usually have sufficiently low AC impedance for this application. However, if actual components used in the e-chuck power supply 35 have significant impedance for the frequency component range of the grounding pulse, one may add capacitors of adequate size between the electrical nodes V+/V− and the system ground or the equivalent to render the actual components more ideal.

Two current return paths from the wafer substrates 31 to the system ground are thus formed, namely, current path 37A which comprises capacitance Cw-ch+ and DC voltage source 351, and current path 37B which comprises capacitance Cw-ch− and DC voltage source 352. The current paths 37A and 37B combined act as a current return path when a pulse current is injected to wafer substrate 31 through the pulse current pin 32.

In this embodiment, the wafer grounding is performed using the electrical zapping technique. Specifically, in the step 396, a single (drive-side) pulse current pin 32 is arranged to be in contact with an exposed surface of a backside film or films 33, which are formed on the backside of the wafer substrate 31 and contain dielectric material layers such as silicon oxide or/and silicon nitride films. The tip shape of the pulse current pin 32 may be, but not limited to, rounded or moderately pointed. In another embodiment, the pulse current pin 32 may be a coil spring or a cantilever or have any other shape that has a relatively small area capable of touching the exposed surface of the backside film 33 with little but sustainable pressure, without causing obvious mechanical damage to the backside films.

When wafer substrate grounding is performed, the single (drive-side) pulse current pin 32 should be connected with the grounding pulse generator 36. For example, in a switch SW1, node 301A is connected with node 301B.

As an initial state, the tip of the pulse current pin 32 is pressed against the surface of the backside films 33. The wafer substrate 31 is electrically floated, DC wise, and isolated from the single pulse current pin 32 by the backside dielectric film(s) 33. The potential of the substrate 31 is electro-statically held at a certain electrical potential near ground level by the capacitance Cw-ch+ and Cw-ch− and e-chuck power supply 35.

A high-voltage (e.g., greater than 100 volts) grounding pulse or pulses is then applied from the grounding pulse generator 36 to the single pulse current pin 32, via the resistor 301R and the connected switch SW1 (node 301A connected with node 301B) (step 397). Although positive pulses have been exemplified in the figure, other waveforms such as negative pulses may be used instead. It would be understood by those skilled in the art that the resistor 301R may be implemented either externally or internally to the grounding pulse generator 36. Moreover, the grounding pulses may be DC or AC coupled to the single pulse current pin 32 according to design choice of implementation. In some embodiments, if AC is coupled to the single pulse current pin, the pulse current pin can act as a return path for the injected pulse current. When being applied to the pulse current pin 32, the grounding pulse(s) also charge stray capacitance C1 and a small capacitance formed between the single pulse current pin 32 and the wafer substrate 31.

Very high electrical field is thus formed across the backside dielectric films 33 between the single (drive-side) pulse current pin 32 and wafer substrate 31 (whose potential is held near ground level by the capacitance Cw-ch+ and Cw-ch− and e-chuck power supply 35). This high electrical field causes a dielectric breakdown through the backside films 33. A breakdown current thus flows through the backside films 33 between the single pulse current pin 32 and the wafer substrate 31. This breakdown current is a very intense, short-duration pulse current sourced by the stray capacitance C1 and the small capacitance between the single ground pin 32 and the wafer substrate 31. The flow of the breakdown current creates an initial current path 39 between the single pulse current pin 32 and the wafer substrate 31.

Immediately following the breakdown current, additional current sourced by the grounding pulse generator 36 via resistance 301R starts to flow into the current path 39. This subsequent current is named "grounding pulse current", as has been defined in the "BACKGROUND OF INVENTION" section in conjunction with FIG. 1. There is no clear separation between the breakdown current and the grounding pulse current. However, the grounding pulse current may continue to be sourced by the grounding pulse generator 36 until the last grounding pulse generation is completed. This may help to further reduce and/or stabilize the resistance of the resultant current path, i.e. a wafer bias current path transformed from the previously created current path 39.

Both the breakdown current and the grounding pulse current flow in the wafer substrate 31 and then flow out of the wafer substrate 31 through the above mentioned current return paths 37A and 37B (step 398). The resistance of the current return paths 37A and 37B influences the breakdown current and the grounding pulse current. For a given grounding pulse applied to the single pulse current pin 32, the higher the resistance of current return paths 37A/37B is, the more the actual breakdown and ground pulse current shall be restricted.

The low resistance current return paths 37A/37B allow the grounding pulse generator 36 to drive sufficient pulse current to create a stable and low-resistance DC path between the single pulse current pin 32 and the wafer substrate 31, whereby establishing the wafer bias current path between the single pulse current pin 32 and the wafer substrate 31 where the current path 39 was located. In other words, when a stable and low-resistance DC path between the single pulse current pin 32 and the wafer substrate 31 is established, the current path 39 initiated by the dielectric breakdown can be considered to have been transformed into a stable and low-resistance DC path which is now ready for use for wafer biasing.

Compared to the conventional apparatus (FIG. 2), the present embodiment eliminates the use of the (return-side) neutralizing pin 11B, which was used as a current return path, and its associated grounding damage. Moreover, only one wafer bias current path, instead of two as in the conventional apparatus (15A/15B, FIG. 1), is created through the backside film 33. It should be noted that the current flowing into the wafer substrate 31 (i.e. the breakdown current and the grounding pulse current combined) does not need to charge up the wafer substrate potential to initiate another dielectric breakdown, as opposed to the conventional apparatus.

The simplicity in architecture and operation of the present embodiment allows for straightforward optimization of the grounding drive condition with fewer restrictions needed for minimizing the grounding damage while assuring a stable and low-resistance wafer bias current path.

Subsequently, in the step 399 or say the wafer biasing phase, the switch SW1 is switched to other end to connect nodes 301A and 301C. Accordingly, the wafer substrate 31 is driven to and held at the predetermined potential provided by a wafer bias supply 38, such as a high-voltage DC power supply, via the single pulse current pin 32.

The charged particle beam apparatus 30 can be one that is able to produce a 2-dimensional image of the wafer substrate 31 by detecting secondary, backscattered electrons, mirror electrons, or other kind of electrons from the surface of the wafer substrate 31 upon impingement by a charged particle beam generated by the charged particle beam apparatus 30.

Mirror electrons are the probe beam or illumination beam electrons repelled back by an electrical field generated by the surface potential of the wafer substrate in near proximity of the wafer substrate surface, where the probe beam or illumination beam electrons do not make physical impingement on the surface material, but have an indirect impingement with the wafer substrate surface via field generated from the surface. Taking account of this indirect impingement interpretation, mirror electrons are defined as electrons emitted from the surface of the wafer substrate upon impingement by an electron beam throughout this application.

In other words, in the present invention the charged particle beam apparatus 30 is at least comprised of a charged particle beam generator for generating a charged particle beam to impinge on the surface of a wafer substrate, an electron detector to detect electrons (secondary, backscattered, mirror, . . . ) from the surface of the wafer substrate being impinged, and an image generator electrically coupled to the electron detector for generating images of the impinged area on the substrate surface according to the detected electrons.

Figure 4A:
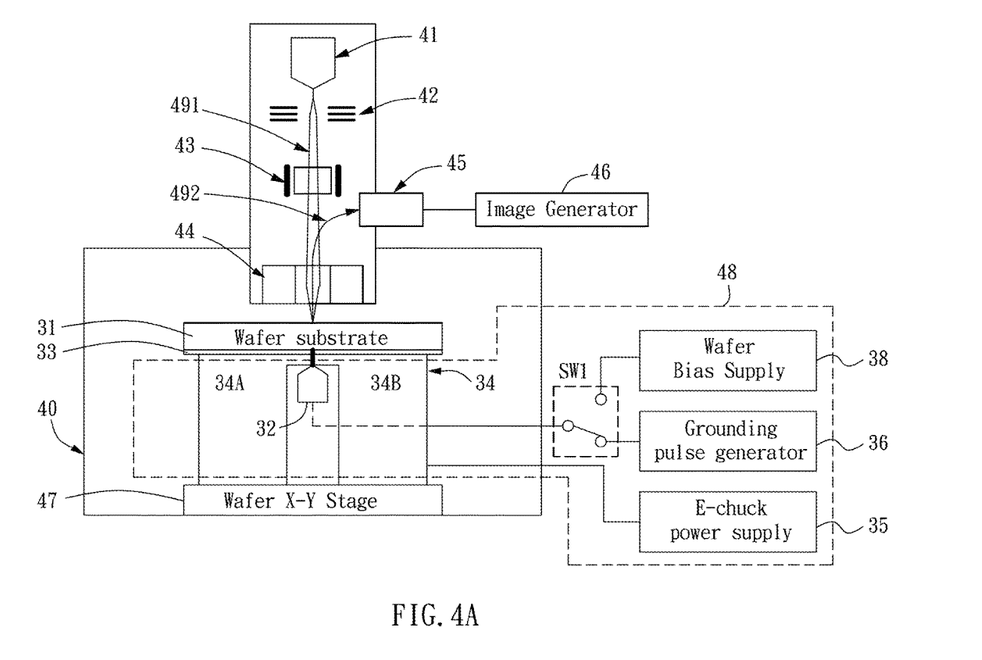
FIG. 4A is a schematic illustration of a scanning type charged particle beam microscope.

For example, the charged particle beam apparatus 30 may be a scanning-type electron microscope. FIG. 4A is a schematic illustration of a scanning-type charged particle beam microscope, providing one example for charged particle beam apparatus 30 to which the present invention (as the apparatus shown in FIG. 3A) may be adapted. Same reference numerals are used here to denote the same elements as in the previous embodiment (FIG. 3A) where applicable.

As would be understood by those skilled in the art, if the charged particle is an electron, FIG. 4A illustrates a Scanning Electron Microscope (SEM). If the charged particle is an on FIG. 4A illustrates a Focused Ion Beam (FIB) microscope.

As shown in FIG. 4A, inside a vacuum chamber 40, the wafer substrate 31 placed facing against an objective lens 44, is mounted on the wafer mount 34, with the pulse current pin 32 arranged to be in contact with the backside film 33 of the wafer substrate 31. The pulse current pin 32 is part of a wafer grounding/biasing apparatus 48 which is similar to the embodiment of FIG. 3A. The pulse current pin 32 is electrically connected to the grounding pulse generator 36 and the wafer bias supply 38 through relay switches (SW1). Also as shown, in this embodiment, the wafer mount 34 is an e-chuck which comprises two chuck electrodes 34A and 34B, and wherein both of the electrodes 34A/34B are wired to the e-chuck power supply 35. Other details of the wafer grounding/biasing apparatus 48 have been described in conjunction with FIG. 3A, and will not be repeated here.

A charged particle beam 491 sourced by a charged particle beam generator 41 is condensed to form a fine spot beam at the surface of the wafer substrate 31, called a probe beam, as the beam travels through a condenser lens 42 and an objective lens 44. A beam deflector unit 43 deflects the condensed charged particle beam 491, shifting the landing position of the probe beam on the wafer substrate surface. When an image is acquired, 1) the beam deflector unit 43 dynamically deflects the charged particle beam 491 in coordination with the movement of a wafer X-Y stage 47 whereupon the substrate 31 is secured for imaging, such that a required surface area of the wafer substrate 31 is raster scanned by the probe beam, 2) during the raster scan, an electron detector 45 continuously collects secondary electrons 492 (and/or backscattered electrons in case if the charge particle beam is electron beam) produced by the probe beam's impingement as the probe beam scans through the required area of the wafer surface 31, and outputs a signal proportional to the electron collection rate, and 3) an image generator 46 electrically coupled with the electron detector 45 for processing a series of the detector output data digitized at a sampling rate and thereby producing a pixelized image of the required area on the surface of the wafer substrate 31.

Figure 4B:
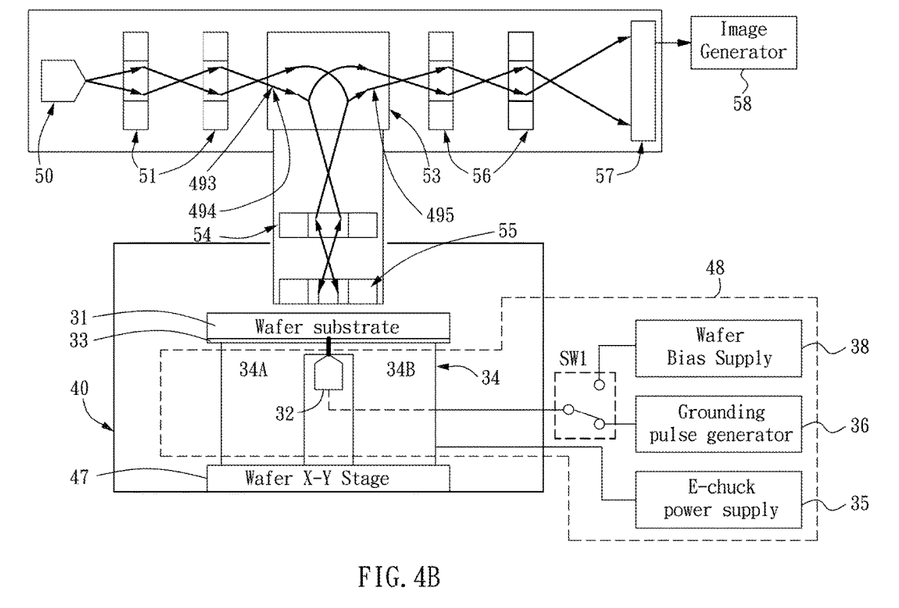
FIG. 4B is a schematic illustration of LEEM (Low-energy Electron Microscopy)/MEM (Mirror Electron Microscopy) apparatus, a projection type charged particle beam microscope.

For another example, the charged particle beam apparatus 30 may be a projection type electron microscope. FIG. 4B is a schematic illustration of LEEM (Low-energy Electron Microscopy)/MEM (Mirror Electron Microscopy) apparatus, a projection type charged particle beam microscope, providing one example of charged particle beam apparatus 30 to which the present invention (as the apparatus shown in FIG. 3A) may be adapted. Same reference numerals are used here to denote the same elements as in the previous embodiment (FIG. 3A) where applicable.

LEEM and MEM utilize low-energy electrons emitted from a specimen surface upon impingement of an illumination electron beam to form an image. A LEEM image is produced if an illumination electron beam directly impinges the specimen surface, generating secondary electrons. A MEM image is produced if the illumination beam electrons are repelled back in near proximity to the specimen surface, producing mirror electrons via indirect impingement.

As shown in FIG. 4B, inside a vacuum chamber 40, the wafer substrate 31 placed facing against an objective lens 55, is mounted on the wafer mount 34, with the pulse current pin 32 arranged to be in contact with the backside film 33 of the wafer substrate 31. The pulse current pin 32 is part of a wafer grounding/biasing apparatus 48 which is similar to the embodiment of FIG. 3A. The pulse current pin 32 is electrically connected to the grounding pulse generator 36 and the wafer bias supply 38 through relay switches (SW1). Also as shown, in this embodiment, the wafer mount 34 is an e-chuck which comprises two chuck electrodes 34A and 34B, wherein both of the electrodes 34A/34B are wired to the e-chuck power supply 35. Other details of the wafer grounding/biasing apparatus 48 have been described in conjunction with FIG. 3A, and will not be repeated here.

A projection beam 495 in FIG. 4B is sourced by secondary electrons in case of LEEM operation and is sourced by mirror electrons in case of MEM operation. The projection beam 495 is brought into a projection optics comprising an objective lens 55, a transfer lens 54, a beam separator 53 and projection lenses 56, and forms a magnified image onto a 2-dimensional electron detector 57. The output signal of the 2-dimensional electron detector 57 is brought to image generator 58, which is electrically coupled to the 2-dimensional electron detector 57 and processes the detector output signals and generates an image accordingly, wherein the image represents a 2-dimensional distribution of the surface property of the wafer 31, such as surface topology, electrical potential, materials, etc.

The illumination electron beam 493 sourced by an electron beam generator 50, travels through an illumination beam path 494 while being condensed to form a parallel flood electron beam by a illumination optics comprising condenser lenses 51, the beam separator 53, the transfer lens 54 and the objective lens 55, and arrives at the surface of the wafer substrate 31, directly/indirectly impinging on the required surface area of the wafer substrate 31. The beam separator 53 steers the illumination beam 493 and projection beam 495 in the same steering direction such that the required optical elements unique to each of the illumination path and the projection path shall not physically and electromagnetically interfere with each other.

Although the electron microscope is exemplified in the embodiment as described above in conjunction with FIGS. 4A and 4B, the present invention, as the apparatus illustrated in FIG. 3A, may be adapted in general to a charged particle beam apparatus, such as electron beam wafer inspection systems, focused ion beam system, electron beam direct write lithography system, critical-dimension (CD) SEM, defect review SEM, electron beam thin film metrology system and surface or material analysis systems based on SEM or FIB.

Figure 5:
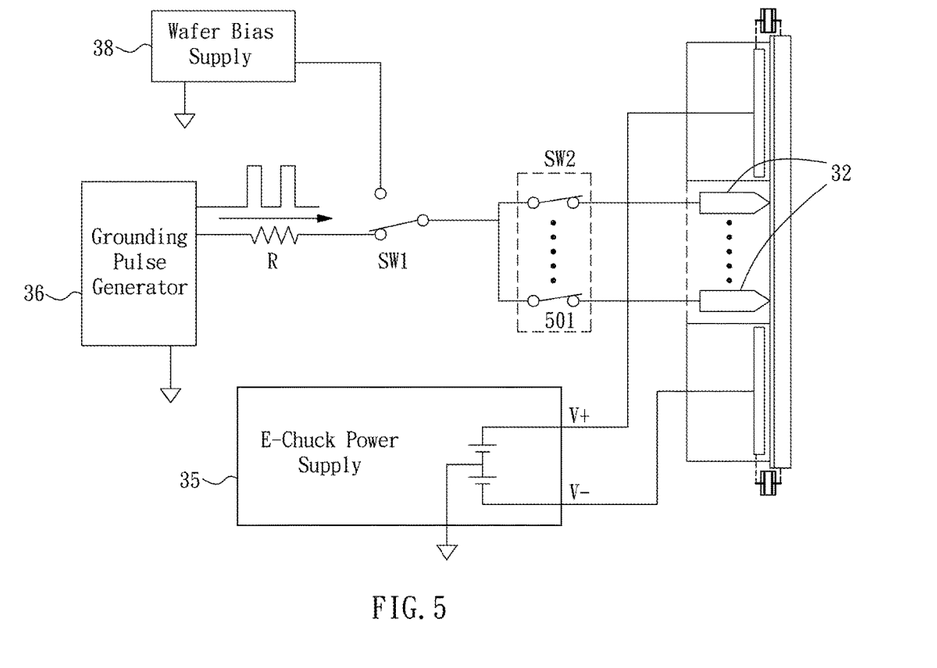
FIG. 5 is a schematic illustration of a wafer grounding and wafer biasing apparatus according to a second embodiment of the present invention.

FIG. 5 is a schematic illustration of a wafer grounding and wafer biasing apparatus according to a second embodiment of the present invention. Same reference numerals are used here to denote the same elements as in the previous embodiment (FIG. 3A) where applicable. In the embodiment, multiple (drive-end) pulse current pins 32 are used to acquire multiple wafer bias current paths. Only one of the pulse current pins 32 is driven to make the wafer bias current path at a time by the grounding pulse generator 36, while the rest of the pulse current pins 32 are kept floating or connected to an appropriate electrical node through high impedance path by using a switch array SW2 (which comprises multiple switches 501 that can be switched on/off), which selects one of the multiple pulse current pins 32 to be driven by the grounding pulse generator 36 at a time. By repeating the above grounding action (as described in conjunction with FIG. 3A) for the individual pin 32, multiple wafer bias current paths will be created one at a time. Multiple wafer bias current paths provide redundancy in wafer bias connections to the wafer substrate and improve the reliability of the biasing apparatus. It is noted that the wafer grounding and wafer biasing apparatus in this embodiment is adaptable to a charged particle beam apparatus, as in the embodiment of FIG. 3A.

Figure 6:
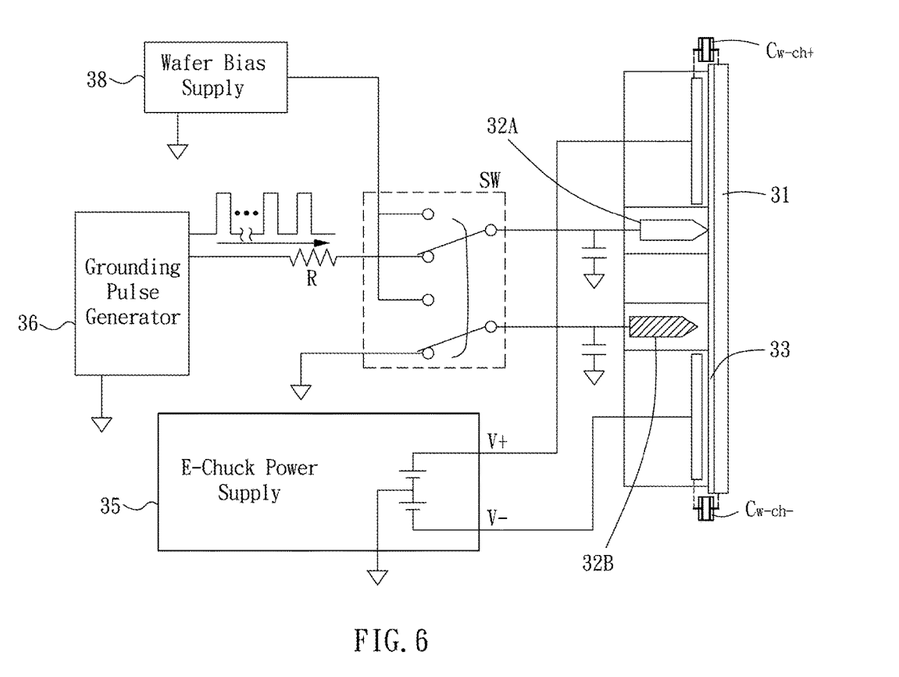
FIG. 6 is a schematic illustration of a wafer grounding and wafer biasing apparatus according to a third embodiment of the present invention.

FIG. 6 is a schematic illustration of a wafer grounding and wafer biasing apparatus according to a third embodiment of the present invention. Same reference numerals are used here to denote the same elements as in the first embodiment (FIG. 3A) where applicable. In the embodiment, a return-side neutralizing pin 32B (such as the return-side neutralizing pin 11B in FIG. 2) is removed. In the specification, the term "remove" may mean that the return-side neutralizing pin 32B is either recessed back (from contact with the backside films 33) or physically removed. As the return-side neutralizing pin 32B has no effect on the grounding process, the conventional implementation represented in FIG. 2 is made substantially equivalent to the first embodiment of the present invention illustrated in FIG. 3A. However, the neutralizing pin 32B in this embodiment can be used as a lifting pin to physically separate the wafer substrate from the wafer grounding and wafer biasing apparatus after the wafer biasing and wafer grounding process is complete. It is noted that the wafer grounding and wafer biasing apparatus in this embodiment is adaptable to a charged particle beam apparatus, as in the embodiment of FIG. 3A.

Although the present invention has been explained in relation to its preferred embodiment, it is to be understood that other modifications and variation can be made without departing from the spirit and scope of the invention as hereafter claimed.

What is claimed is:

1. A wafer grounding and biasing method, comprising:
   positioning a wafer substrate on a wafer mount;
   arranging only one current pin at a time to be in contact with said wafer substrate;
   holding said wafer substrate with the wafer mount, wherein the wafer mount comprises a chuck electrode, and a capacitive coupling is formed between said chuck electrode and said wafer substrate; and
   providing a current to the wafer mount via said current pin, wherein said current flows in a return path only through said capacitive coupling.

2. The wafer grounding and biasing method of claim 1, wherein said chuck electrode comprises a positive chuck electrode and a negative chuck electrode.

3. The wafer grounding and biasing method of claim 2, wherein said capacitive coupling comprises a positive capacitive coupling between said positive chuck electrode and said wafer substrate, and a negative capacitive coupling between said negative chuck electrode and said wafer substrate.

4. The wafer grounding and biasing method of claim 1, wherein said current is a bias current provided by a wafer bias supply circuit.

5. The wafer grounding and biasing method of claim 4, wherein said bias current is a direct current (DC).

6. The wafer grounding and biasing method of claim 1, wherein said current is provided by a grounding pulse generator circuit.

7. The wafer grounding and biasing method of claim 6, wherein said current is a pulsed current.

8. The wafer grounding and biasing method of claim 7, wherein said pulse current is a direct current (DC).

9. The wafer grounding and biasing method of claim 1, further comprises: providing a switch for selecting said current either from a wafer bias supply circuit or a grounding pulse generator circuit.

10. The wafer grounding and biasing method of claim 1, further comprises: pushing said wafer substrate away from said wafer mount with a lifting pin.

11. The wafer grounding and biasing method of claim 1, wherein the current is provided in a state where only said current pin and said wafer mount are in contact with said wafer substrate.

12. A wafer grounding and biasing apparatus, comprising:
    a wafer mount for supporting a wafer substrate, wherein the wafer mount comprises a chuck electrode, and a capacitive coupling is formed between said chuck electrode and said wafer substrate; and
    only one current pin at a time arranged for contacting said wafer substrate;
    wherein a current is provided to the wafer mount via said current pin, and said current flows in a return path only through said capacitive coupling.

13. The wafer grounding and biasing apparatus of claim 12, wherein said chuck electrode comprises a positive chuck electrode and a negative chuck electrode.

14. The wafer grounding and biasing apparatus of claim 13, wherein said capacitive coupling comprises a positive capacitive coupling between said positive chuck electrode and said wafer substrate, and a negative capacitive coupling between said negative chuck electrode and said wafer substrate.

15. The wafer grounding and biasing apparatus of claim 12, further comprises a wafer bias supply circuit for providing said current.

16. The wafer grounding and biasing apparatus of claim 15, wherein said current is a direct current (DC).

17. The wafer grounding and biasing apparatus of claim 12, further comprises a grounding pulse generator circuit for providing said current.

18. The wafer grounding and biasing apparatus of claim 17, wherein said current is a pulsed current.

19. The wafer grounding and biasing apparatus of claim 18, wherein said pulse current is a direct current (DC).

20. The wafer grounding and biasing apparatus of claim 12, further comprises: a switch for selecting said current either from a wafer bias supply circuit or a grounding pulse generator circuit.

21. The wafer grounding and biasing apparatus of claim 12, further comprises: a lifting pin for pushing said wafer substrate away from said wafer mount.

22. The wafer grounding and biasing apparatus of claim 12, wherein the current is provided in a state where only said current pin and said wafer mount are in contact with said wafer substrate.

* * * * *